United States Patent
Blanchard et al.

(10) Patent No.: US 6,228,557 B1
(45) Date of Patent: May 8, 2001

(54) PROCESSING METHOD AND APPARATUS FOR PRODUCTION OF LITHOGRAPHIC PRINTING PLATES

(75) Inventors: Simon John Blanchard, Harrogate; John Michael Kitteridge, Leeds, both of (GB)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/400,286

(22) Filed: Sep. 21, 1999

(30) Foreign Application Priority Data

Sep. 23, 1998 (GB) .................................................. 9820662

(51) Int. Cl.$^7$ .............................. G03F 7/07; G03D 9/00; G03D 9/02; G03D 13/04; G03D 3/02
(52) U.S. Cl. ........................ 430/204; 430/403; 396/582; 396/587; 396/626; 396/627; 396/628; 396/632; 396/638
(58) Field of Search .................................... 430/204, 403; 396/582, 587, 627, 628, 626, 573, 632, 638

(56) References Cited

U.S. PATENT DOCUMENTS

| | | | |
|---|---|---|---|
| 4,859,290 | * 8/1989 | Watkiss | 430/204 |
| 5,066,570 | * 11/1991 | Nakamura et al. | 430/403 |
| 5,307,109 | * 4/1994 | Miyasaka et al. | 430/204 |
| 5,455,651 | * 10/1995 | Verhoest et al. | 430/204 |
| 5,795,697 | * 8/1998 | Coppens et al. | 430/204 |
| 5,834,156 | * 11/1998 | Urasaki et al. | 430/204 |

* cited by examiner

Primary Examiner—Richard L. Schilling
(74) Attorney, Agent, or Firm—Breiner & Breiner

(57) ABSTRACT

An apparatus is provided for processing a lithographic printing plate precursor comprising an aluminium support, an image-receiving layer and a silver halide emulsion layer. The apparatus comprises a tank for holding a processing liquid, at least one set of driving rollers, at least one guide roller or guide plate and means for providing direct electrical contact between the lithographic printing plate precursor and other electrically conducting surfaces in the apparatus which are in contact with the processing liquid. A method of processing a lithographic printing plate precursor using the apparatus is also disclosed. Undesirable electrochemical cell formation during processing, and the consequent deleterious effects on silver image formation, are prevented and subsequent problems with poor plate run length can therefore be avoided.

17 Claims, 1 Drawing Sheet

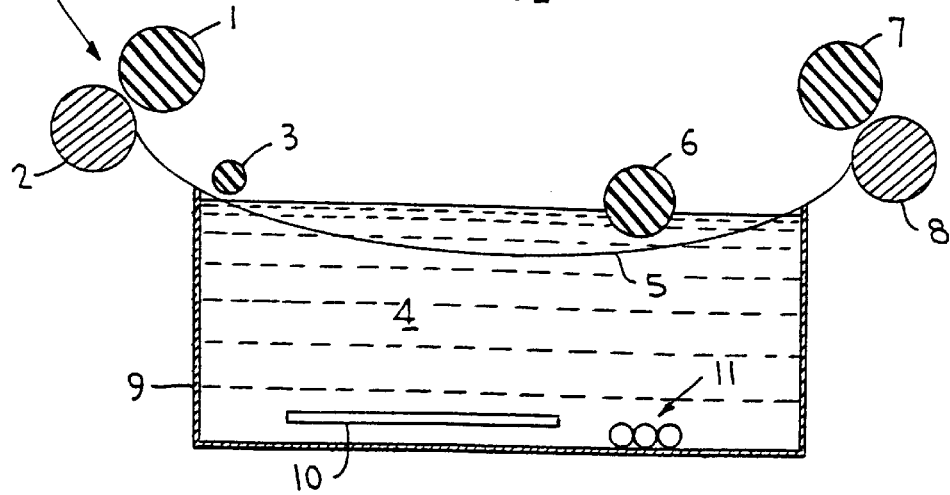
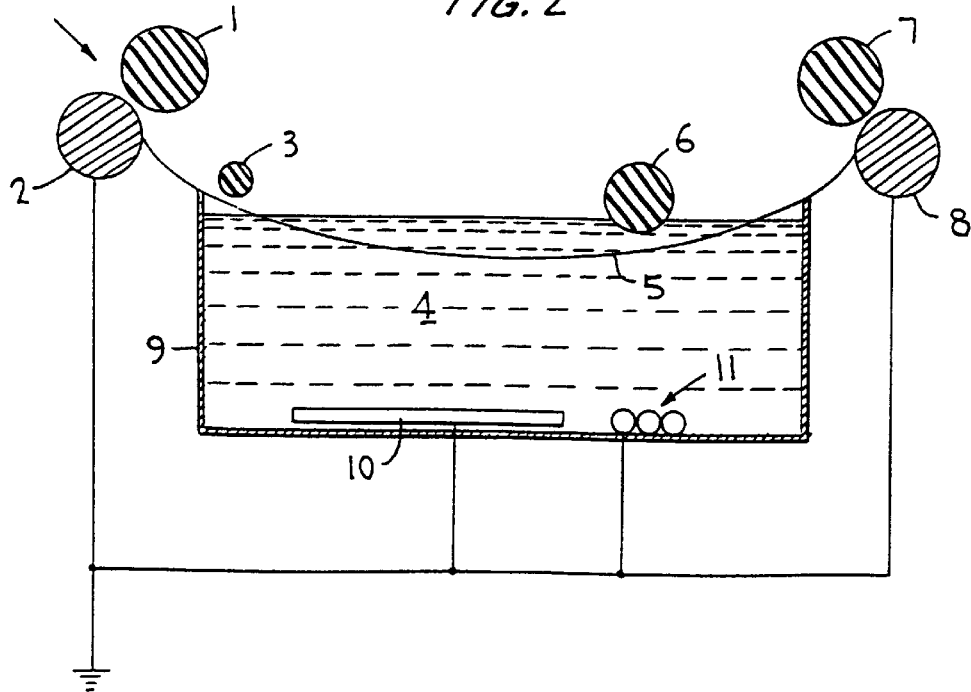

PROCESSING METHOD AND APPARATUS FOR PRODUCTION OF LITHOGRAPHIC PRINTING PLATES

The present invention relates to a method and apparatus for processing a presensitised plate precursor in order to produce a lithographic printing plate. More specifically it is concerned with a method for the processing of a presensitised plate precursor comprising a substrate having coated thereon a light sensitive layer including a silver halide emulsion, whereby improved image quality and press durability may be achieved by the elimination of electrochemical reactions which can occur during processing. The invention also provides an apparatus for the performance of said method.

Silver halides are used for printing plate applications in a number of ways. Particularly suitable coatings include those based on the silver complex diffusion transfer- or DTR-process, the principles of which have been fully described in U.S. Pat. No. 2,352,014 and in the publication "Photographic Silver Halide Diffusion Processes" by Andre Rott and Edith Weyde, The Focal Press, London and New York, 1972.

In the DTR process, the unexposed silver halide in an information-wise exposed silver halide emulsion layer is transformed, by treatment with a so-called silver halide solvent, into soluble silver complex compounds which are allowed to diffuse into an image receiving element and are reduced therein by means of a developing agent, generally in the presence of physical development nuclei, to form a metallic silver image having reversed image density values ("DTR image") with respect to the black silver image obtained in the exposed areas of the photographic material. A DTR image-bearing material produced in this way may be used as a planographic printing plate wherein the DTR silver image areas form water-repellent, ink-receptive image areas on a water-receptive, ink-repellent background.

Two different types of DTR system are available. A two-sheet DTR system includes a first element comprising a photographic silver halide emulsion material and a separate image-receiving second element, generally containing a physical development nuclei layer; after forming an image in the image-receiving element, the two elements are placed in contact in the presence of one or more developing agents and one or more silver halide solvents in the presence of an alkaline processing liquid, and subsequently peeled apart, to provide a metallic silver layer in the second element. A single sheet DTR system comprises a single element including a silver halide emulsion layer which is integral, and in water permeable relationship, with an image-receiving layer, which again generally includes a physical development nuclei layer. Following exposure, the element is treated with one or more developing agents and one or more silver halide solvents in the presence of an alkaline processing liquid in order to provide a metallic silver layer in the image-receiving layer. The present invention is concerned with the latter type of DTR system.

Single sheet DTR systems are themselves provided in two alternative versions. U.S. Pat. No. 4,722,535 and British Patent No. 1241661 describe a system wherein a support is provided on its surface with a silver halide emulsion layer, over which is provided an image-receiving layer including physical development nuclei; following information-wise exposure, and subsequent development, the imaged element may be used as a printing plate without removal of the spent emulsion layer. Alternatively, a DTR system may comprise a support provided on its surface with an image-receiving layer including physical development nuclei, over which is provided a silver halide emulsion layer; after information-wise exposure, and subsequent development, the imaged element is washed with water to remove the spent emulsion layer, to leave a support carrying a silver image which may then be utilised as a printing plate. Lithographic printing plates produced from the latter type of system are disclosed in European Patents Nos. 131462, 278766 and 410500.

The present invention is concerned with the means of processing printing plates based on the latter type of single sheet DTR system, in which the image-receiving layer, containing physical development nuclei, is in direct contact with the support. Typically, the support in such a system comprises aluminium which has preferably been grained and anodised on one surface in order to improve its lithographic characteristics. Whilst grained and anodised aluminium is a particularly suitable support material in terms of its printing properties, however, its use in conjunction with silver halide-based imaging systems can lead to difficulties being experienced during the processing of said systems, due to the electrochemical nature of such processing. Indeed, the method of processing of the said systems is critical to the subsequent performance of the printing plates.

During the processing stages, the areas of a plate exposed to actinic radiation undergo a process known as chemical development. Said process involves the conversion of exposed silver halide grains into filamentary metallic silver by the action of a reducing agent dissolved in the developer solution. Typically, the reducing agent-otherwise referred to as a developing agent—comprises hydroquinone which is provided in aqueous alkaline solution. The reduction process may be represented schematically by the following equation:

$$2AgX + H_2Q + 2OH^- = 2Ag + Q + 2X^- + 2H_2O \qquad [1]$$

where $H_2Q$ is hydroquinone and X is chloride, bromide or iodide, or any combination thereof.

By contrast, in the unexposed areas the silver halide crystals are complexed by a silver halide solvent, which is typically a simple inorganic salt such as sodium thiosulphate. The resulting complex then diffuses to the nucleation surface which, in the case of a lithographic single sheet DTR system in which the image-receiving layer is in direct contact with the support, comprises a grained and anodised aluminium surface onto which has been coated a nucleating layer; said nucleating layer typically comprises a colloidal metal or metal sulphide. Reduction then takes place by the action of a reducing agent which, again, is typically supplied in the form of an alkaline solution of hydroquinone. This process is generally referred to as physical development and results in the production of a form of silver which successfully accepts lithographic printing ink. The physical development process can be schematically represented by the following equations:

$$AgX + 2S_2O_3^{2-} = [Ag(S_2O_3)_2]^{3-} + X^- \qquad [2]$$

$$2[Ag(S_2O_3)_2]^{3-} + H_2Q + 2OH^- = 2Ag + Q + 4S_2O_3^{2-} + 2H_2O \qquad [3]$$

where the symbols have the meanings previously ascribed.

The conditions of processing, including pH, temperature and concentration of reducing agent, are chosen such that the chemical development process is essentially complete within 2 or 3 seconds of the moment at which the exposed parts of the plate come into contact with the developer, whilst the time taken for completion of the physical development process can be in the region of 45 seconds. During the course of the development process, in view of the chemical reactivity of aluminium metal, it is possible for chemical attack on the aluminium support to take place. Whilst the surface of the aluminium which carries an anodic layer is protected from such attack, it is generally true that the back surface and the edges of the aluminium plate have very little anodising and, once any anodising has been removed, it is possible for corrosion of the aluminium to occur. The presence of this corroded aluminium surface, together with the silver image, and the developer acting as an electrolyte, results in the formation of an electrochemical cell. The principles of such electrochemical reactions are described in more detail in the publication "Electrochemistry" by J. Koryta, J. Dvorak and V. Bohackova, Methuen and Company, London, 1970. The reactions can be represented in simple schematic form as follows:

At the anode:

$$Al + 4OH^- \rightarrow AlO_2^- + 2H_2O + 3e^- \qquad [4]$$

At the cathode:

$$Ag(S_2O_3)_2^{3-} + e^- \rightarrow Ag + 2S_2O_3^{2-} \qquad [5]$$

The resulting current flow can, therefore, seriously interfere with the formation of the silver image. However, the effect only usually becomes apparent when the current flow from the relatively large area of aluminium corroding on the back of the plate is concentrated onto relatively small silver image areas, resulting in variations in the amount of silver deposited in the small silver image areas and changes in the colour of the silver image. Such variations are undesirable since low silver image weights can give rise to reduced plate run length and variations in image colour are cosmetically unacceptable.

It is an object of the present invention to avoid such undesirable side-effects during processing of lithographic printing plate precursors of the single sheet DTR type described, thereby allowing for the production of printing plates having improved image quality and press durability. The invention seeks to achieve this object by preventing the formation of an undesirable electrochemical cell of this type by the mechanisms indicated, and thereby eliminating the difficulties associated with corrosion of the aluminium support.

It is, of course, possible to prevent the formation of an undesirable electrochemical cell such as that described by not allowing the surface of the aluminium to contact the developer liquid; this may be achieved most simply by the application of an inert coating to the back surface of the aluminium, as described in our earlier PCT Patent Application No. PCT/EP/982191. However, the application of such a coating causes additional difficulties during the plate manufacturing process, and inevitably leads to additional manufacturing costs. It would also be possible to prevent contact between the aluminium and the developer liquid by suitably designing a processing apparatus and method to that end. However, such an apparatus and method would be likely to be difficult to operate and particularly sensitive to the working practices of the end user, with the result that inconsistencies in performance would be likely to occur.

Consequently, it is a particular further object of the present invention to provide an economical means by which the said side-effects may be simply and reliably avoided, in particular by providing a processing method and apparatus which prevent the formation of an undesirable electrochemical cell during processing.

According to a first aspect of the present invention, there is provided an apparatus for processing a lithographic printing plate precursor comprising an aluminium support, an image-receiving layer and a silver halide emulsion layer, said apparatus comprising a tank for holding a processing liquid, at least one set of driving rollers, at least one guide roller or guide plate, and means for providing direct electrical contact between the lithographic printing plate precursor and other electrically conducting surfaces comprised in the said apparatus and in contact with the processing liquid.

According to a further aspect of the invention there is provided a method for processing a lithographic printing plate precursor comprising an aluminium support, an image-receiving layer and a silver halide emulsion layer, said method comprising:

(i) information-wise exposing the plate precursor; and (ii) processing the exposed precursor through a processing liquid contained in an apparatus according to the first aspect of the invention, thereby to prevent the formation of an undesirable electrochemical cell by creating an earth connection to the plate during its passage through said processing liquid.

Preferably, the electrical contact between the plate precursor and the electrically conducting surfaces is achieved by the provision of at least one of a driving roller or guide roller or guide plate comprising an electrically conducting material; most preferably, the electrically conducting material comprises a metal, typically stainless steel, and the electrically conducting surface comprises a driving roller or a guide roller.

Electrical contact between the plate precursor and the electrically conducting surfaces is most conveniently achieved by any of the standard techniques known to those skilled in the art for the connection of electrical circuits to rotating or moving assemblies. Thus, for example, it is possible to employ brushes made of graphite or other forms of carbon, precious metals, electrically conducting alloys such as brass, or plastics which are loaded with electrically conducting materials, the said brushes being used in association with holders and/or springs as required for optimum operational effectiveness; specific requirements in this regard are likely to be dictated by particular individual features of processor design. Naturally, it is preferred that the brushgear should be formed of material which is resistant to corrosion by the developer, or is otherwise protected from such corrosive effects.

The particular means by which the said electrical contact may be established is not critical to the performance of the invention. Thus, electrical contact between the plate and a metal roller surface, or the surface of any metal shaft or axle forming part of a roller will suffice; contact with the end or centre of the shaft would also be satisfactory. In practice, it is found that optimum results are achieved when contact is made with the surface or end of the shaft of a roller, since this allows the roller surface to remain free of obstructions and facilitates reduced wear due to lower surface speeds.

Preferably the apparatus according to the first aspect of the present invention will include two sets of driven rollers, one set at the point of input of the plate precursor and the second set at the corresponding output point. Optionally, at least one of the output rollers may be in direct contact with the processing liquid contained in the tank. The apparatus also advantageously includes at least two guide rollers and a guide plate, designed to ensure smooth passage of the plate precursor through the apparatus. It is also preferred that the apparatus should include a heating element, cooling coils and developer circulation means, such as stirring means or other means of agitation. It is desirable that at least one roller in each set of driven rollers should comprise a metal roller, preferably a stainless steel roller. Optionally, both rollers in a set may comprise metal rollers. However, particularly favourable results are obtained by employing sets of driven rollers comprising a top rubber roller and a bottom metal roller. One or more of the guide rollers may comprise a metal roller. Alternatively or additionally, of course, it is possible to achieve direct electrical contact with the back of the plate precursor by employing a plate guide formed wholly or partly from electrically conducting materials.

Electrical contact is made from the electrically conducting surfaces to other areas of metal in the developer tank, for example the tank walls, metal framework, and items such as cooling coils or heaters. In addition, an inert electrode, such as a stainless steel mesh, may be incorporated in the tank below the plate guide.

It is preferred, on grounds of safety and convenience, that the electrical contacts should be earthed, but this is not essential to the successful application of the invention.

The apparatus and method of the invention will now be illustrated, though without limitation, by reference to the accompanying drawings, in which:

FIG. 1 is a schematic representation of a plate processor according to the known art; and FIG. 2 is a schematic representation of a plate processor according to the present invention.

Referring firstly to FIG. 1, an exposed printing plate precursor of the type previously herein described is fed, with the exposed side face upwards, between the driven input rollers (1) and (2), being guided by the first guide roller (3) into the trough of developer (4) lying above the guide plate (5). The plate precursor then passes under the second guide roller (6), which may or may not be driven, still immersed in the developer, and finally leaves the tank (9) through a set of driven exit rollers (7) and (8). All the rollers comprised in the said prior art apparatus are rubber rollers. The developer tank also includes developer circulation means (not shown), heating element (10) and cooling coils (11).

A particular embodiment of the invention may now be seen by reference to FIG. 2, in which the driven rollers (2) and (8) comprise metal rollers, whilst the driven rollers (1) and (7) comprise rubber rollers. Either or both of the guide rollers (3) and (6), and/or the guide plate (5) may also be comprised of metal. These components are electrically connected to other metal parts in the developer liquid by means of a common earth connection. The plate precursor is passed through the apparatus in the same fashion as described in relation to FIG. 1.

After passage through the said developing stage, a silver image is formed in the layer of physical development nuclei on the aluminium base. However, an excess of processing solution may still be present on the plate. Removal of this excess of liquid may be conveniently effected by guiding the plate through a pair of squeezing rollers. The silver image obtained is exposed by washing off all the layers above the layer containing the physical development nuclei; this may be most simply achieved by the use of water, the temperature of which is not critical, but is preferably between 30° and 40° C. Advantageously, the wash water contains an enzyme which is capable of degrading gelatin. The use of a scrubbing action for this wash-off stage is also desirable.

The resulting plate, comprising a silver image on an aluminium base, may subsequently be subjected to a chemical after-treatment designed to increase the hydrophilicity of the background areas, whilst also improving the oleophilicity of the silver image. This chemical treatment preferably involves the use of a lithographic fixer or finisher; typical examples of such compositions are disclosed in European Patent No. 131462.

Following treatment with a fixer or finisher, the plate comprising a silver image on an aluminium support, is ready for use as a printing plate on a printing press.

The processing liquid which is present in the apparatus according to the first aspect of the present invention, for use in the method of the second aspect of the present invention, comprises at least one development agent and at least one silver halide solvent in combination with an aqueous alkaline developing solution. Optionally, the processing liquid may also contain other components, such as development accelerators, oxidation preservatives, calcium sequestering agents, anti-sludge agents, antifoggants, thickening agents and compounds which release bromide ions.

Suitable developing agents for use in accordance with the method of the present invention include hydroquinone derivatives in combination with secondary developing agents. Typically, the hydroquinone compound may be hydroquinone, methylhydroquinone or chlorohydroquinone. Suitable secondary developing agents include p-N-methylaminophenol and, in particular, 1-phenyl-3-pyrazolidone and its derivatives, such as 4-methyl-1-phenyl-3-pyrazolidone, 4,4-dimethyl-1-phenyl-3-pyrazolidone, 4-hydroxymethyl-4-methyl-1-phenyl-3-pyrazolidone and 4-methyl-1-tolyl-3-pyrazolidone.

The preferred silver halide solvent, which acts as a complexing agent for the silver halide, is sodium thiosulphate pentahydrate, which is present in the processing liquid at a level of 5 to 150 g/l, preferably 10 to 80 g/l. Other suitable silver halide solvents include ammonium thiosulphate, potassium thiosulphate, various thiocyanates, polythioethers as disclosed in U.S. Pat. No. 5,200,294, meso-ionic compounds as disclosed in European Patent No. 554585, cyclic imides and thiosalicylates, as disclosed in U.S. Pat. Nos. 4,297,430 and 2,857,276. Combinations of different silver halide solvents may be employed in the processing liquid and, in addition, it is possible to include at least one silver halide solvent in the processing liquid whilst also incorporating at least one silver halide solvent in a suitable layer of the printing plate precursor.

The processing liquid preferably contains amines or alkanolamine derivatives which serve both as silver halide solvents and as development accelerators. Suitable compounds include 2-amino-2-methyl-1-propanol, 2-amino-2-methyl-1,3-propanediol, 2-amino-2-ethyl-1,3-propanediol, tris(hydroxymethyl)aminomethane, 2-amino-2-ethyl-1-propanol, ethanolamine, 1-amino-2-propanol, diethanolamine, 2-methylaminoethanol, triethanolamine, and N,N-diethylaminoethanol.

The aqueous alkaline developing solution may include a variety of alkaline materials, including sodium hydroxide, potassium hydroxide, alkali metal salts of phosphoric and/or silicic acid such as trisodium phosphate or sodium metasilicate, or sodium carbonate. Regeneration of the developer solution is possible by use of any standard techniques, as would be apparent to the skilled person.

The support material used for the lithographic printing plate precursor employed in conjunction with the present invention comprises aluminium, which may either be pure aluminium or may comprise an aluminium alloy, the aluminium content of which is at least 95%. The thickness of this support generally ranges from about 0.13 mm to about 0.5 mm. Alternatively, it is possible to employ a laminate of aluminium with paper or a plastic material. The aluminium supports are preferably grained and anodised according to standard techniques known in the art and described, for example, in U.S. Pat. No. 3,861,917. Most preferably, the grained and anodised aluminium support is produced according to the specification disclosed in European Patent No. 278766.

The image-receiving layer of the lithographic printing plate precursor preferably comprises colloidal silver nuclei, which have been prepared according to the Carey Lea method, at a coating weight of between 0.05 and 10.0 mg/m$^2$, typically between 0.2 and 4.0 mg/m$^2$. Other colloidal nuclei which may be used include the sulphides of heavy metals such as silver or palladium. The colloidal nuclei are optionally dispersed in a binder, for example gelatin or other suitable polymer such as a polyacrylate salt.

The silver halide emulsion layer of the printing plate precursor may comprise any photosensitive silver halide emulsion comprising a hydrophilic colloid binder. The photosensitive silver halide may comprise silver chloride, silver bromide, silver bromoiodide, silver chlorobromide, or the like, or any combinations thereof. In order to achieve a sufficiently high rate of dissolution of the silver halide and a satisfactory gradation for lithographic purposes, a silver halide emulsion mainly comprising silver chloride is generally used. However, it is preferred that the emulsion should include a minimum of 10% silver bromide, in order to ensure that adequate stability on grained and anodised aluminium is obtained. The silver halide emulsion may comprise either coarse or fine grained material and is prepared by any of the standard techniques known in the art. Optionally, the emulsion may be chemically and spectrally sensitised. Details concerning the composition, preparation and coating of silver halide emulsions may be gleaned from the Product Licensing Index, Volume 92, December 1971, Publication 9232.

The silver halide emulsion necessarily includes a binder, which is a hydrophilic colloid, generally a protein, and preferably gelatin. Gelatin may, however, be replaced in part by any of a range of suitable synthetic, semi-synthetic or natural polymers. In addition, the emulsion may also contain various other ingredients, such as antifogging agents, developing agents, development accelerators, wetting agents, stabilisers, acutance dyes and pigments, and matting agents.

Whilst, in view of their high photosensitivity, the use of negative working silver halide emulsions is preferred, direct positive silver halide emulsions that produce a positive silver image in the emulsion layer and a negative silver image on the aluminium support may also be employed. Optionally, an intermediate water-swellable layer may be present between the image-receiving layer and the silver halide emulsion layer. Suitable materials for this purpose are disclosed in European Patent No. 483415.

The invention will now be further illustrated, though without limitation, by reference to the following experiments:

Experiment 1

This example shows that a current flows between a silver image and aluminium substrate.

Two electrodes were prepared. One consisted of a piece of Silverlith® SDB plate from Agfa-Gevaert, and the other was a piece of bare Silverlith® substrate. Both pieces were 50 mm wide and 150 mm long. The back and edges of the SDB plate were covered with sticky tape to prevent contact with the developer.

Both electrodes were stood vertically in a 250 ml beaker, with a separation of approximately 50 mm. Contacts to a data logging ammeter (Keithley model 197A, 3 reading to 200 mA, collecting data at 1 reading per second) were attached to each electrode. A 200 ml aliquot of Silverlith® developer was poured into the beaker, covering each electrode to a depth of approximately 50 mm. Current was logged for 30 seconds after adding developer. Readings were taken, under safe-light conditions, both with unexposed (silver image), and with previously fogged plates. The results are summarised in the following graph:

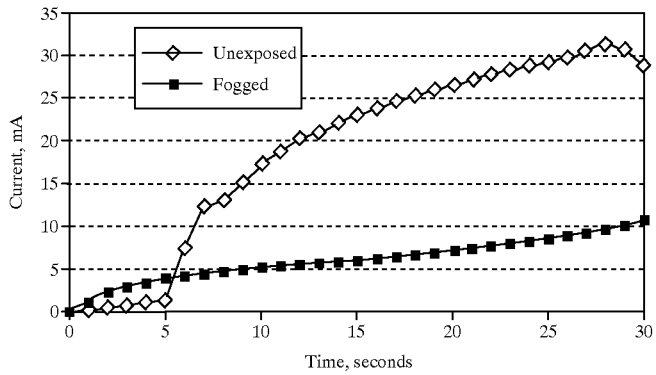

Experiment 2

A commercially available grained and anodised DTR printing plate (Silverlith® SDB from Agfa-Gevaert) measuring 630×417 mm was exposed in contact through a film positive on a print-down frame to a tungsten light source. The film positive comprised images of circular dots 4 mm in diameter and spaced at regular intervals of 5 cm across the width of the film and 7 cm alone the length of the film positive. The positive also contained one larger 38 mm dot. After exposure, the plate was processed with the shorter edge leading through an SLT85-N processor made and supplied by Agfa-Gevaert and containing Silverlith® SDB developer under the manulfacturer's recommended conditions of operation at a speed of 1140 mm/min. The developer section was as shown in FIG. 1. After processing through the SLT-N auto-processor, which included the steps of washing and finisher application after the development stage, the plates were rinsed with fresh water and wiped with a cotton wool swab to remove any residual debris or loosely bonded silver from the imaged 4 mm dots. The amount of silver in each 4 mm dot was then determined using a calibrated XRF counter to give a result for silver weight expressed as g/m$^2$. The 4 mm dots from the length-wise middle section of each plate from the leading edge of the plate to the trailing edge, with reference to the side which entered the processor first (the leading edge) are detailed below.

Test A was as above.

Test B was as for test A, except that metal rollers were fitted as shown in FIG. 2, but without the electrical connections.

Test C (carried out according to the invention) was as above, but with the metal rollers and electrical connections as shown in FIG. 2.

Results:

| | Silver weight, g/m², on dots | | | | | | | | |
|---|---|---|---|---|---|---|---|---|---|
| | dot #1 | dot #2 | dot #3 | Dot #4 | Dot #5 | dot #6 | dot #7 | dot #8 | dot #9 |
| Test A | 0.84 | 0.89 | 0.74 | 0.59 | 0.78 | 0.77 | 0.79 | 0.48 | 0.56 |
| Test B | 0.67 | 0.79 | 0.83 | 0.72 | 0.76 | 0.77 | 0.73 | 0.67 | 0.63 |
| Test C | 0.81 | 0.85 | 0.79 | 0.79 | 0.77 | 0.85 | 0.80 | 0.85 | 0.87 |

| | Test A | Test B | Test C |
|---|---|---|---|
| Average silver on dots, g/m² | 0.72 | 0.73 | 0.82 |
| Standard deviation on dots | 0.14 | 0.06 | 0.04 |
| Silver weight on the larger solid area, g/m² | 0.86 | 0.87 | 0.89 |
| Average deviation from large solid, g/m² | 0.14 | 0.14 | 0.07 |

Test C shows a more consistent, and a higher, silver weight on the dots. A higher silver weight will generally give a longer press run and, because the plate with the processor modification is more consistent, the plate will provide a more consistent press run when used on a lithographic printing press.

Experiment 3

Plates were imaged and processed as in Experiment 2. After any loose material was removed from the imaged dots, the reflected optical density reflected to the plate background was measured with a Vipens densitometer. A total of 72 dots was measured on each plate. The results are summarised in the following table.

| | Dot density range on plate | Standard deviation |
|---|---|---|
| Test A | 0.41–0.89 | 0.15 |
| Test B | 0.23–0.73 | 0.13 |
| Test C (invention) | 0.50–0.77 | 0.05 |

This shows that there is less variation in density of the dots with the above improvement. This is more cosmetically acceptable.

Experiment 4

Plates were imaged and processed as in Experiment 2. Plates were made at different processor speed settings with the normal rubber rollers and again with earthed metal rollers as shown in FIG. 2. After processing, the plates were loaded onto a Didde Glaser, model 860, web offset press and prints made. The prints were examined for evidence of image wear.

| | Number of impressions before loss of image noted | |
|---|---|---|
| Processor speed setting | Rubber rollers | Earthed metal rollers |
| 3 | 15,000 | 80,000 |
| 5 | 25,000 | 72,000 |
| 7 | 80,000 | 80,000 |

This shows the improved consistency in plate run length with the earthed metal rollers.

BRIEF DESCRIPTION OF THE DRAWINGS

FIG. 1
1 & 2. INPUT DRIVEN ROLLERS
3 & 6. GUIDE ROLLERS
4. TROUGH OF DEVELOPER SOLUTION
5. GUIDE PLATE
7 & 8. OUTPUT DRIVEN ROLLERS
9. MAIN BODY OF DEVELOPER TANK
10. HEATER
11. COOLING COILS
FIG. 2
1. INPUT DRIVEN RUBBER ROLLER
2. INPUT METAL ROLLER
3 & 6. GUIDE ROLLERS
4. TROUGH OF DEVELOPER SOLUTION
5. GUIDE PLATE
7. OUTPUT DRIVEN RUBBER ROLLER
8. OUTPUT METAL ROLLER
9. MAIN BODY OF DEVELOPER TANK
10. HEATER
11. COOLING COILS

What is claimed is:

1. An apparatus for processing a lithographic printing plate precursor comprising an aluminium support, an image-receiving layer and a silver halide emulsion layer, said apparatus comprising a tank for holding a processing liquid, at least one set of driving rollers, at least one guide roller or guide plate, and means for providing direct electrical contact between the lithographic printing plate precursor and other electrically conducting surfaces comprised in the said apparatus and in contact with the processing liquid, said electrical contact being facilitated by means of a brushgear.

2. An apparatus as defined in claim 1 wherein said means for providing electrical contact comprises at least one of a driving roller or guide roller or guide plate comprising an electrically conducting material.

3. An apparatus as defined in claim 1 or 2 wherein electrical contacts are earthed.

4. An apparatus as defined in claim 1 or 2 wherein said electrical contact occurs between said lithographic printing plate precursor and the surface or end of a shaft of a roller.

5. An apparatus as defined in claim 1 or 2 which comprises two sets of driven rollers, two guide rollers and a guide plate.

6. An apparatus as defined in claim 5 wherein each set of driven rollers comprises at least one metal roller.

7. An apparatus as defined in claim 5 wherein said sets of driven rollers comprise a top rubber roller and a bottom metal roller.

8. An apparatus as defined in claim 5 wherein said guide plate at least partly comprises an electrically conducting material.

9. An apparatus as defined in claim 2 wherein said electrically conducting material comprises a metal.

10. An apparatus as defined in claim 9 wherein said metal comprises stainless steel.

11. An apparatus as defined in claim 1 or 2 which additionally includes at least one of a heating element, cooling coils and developer circulation means.

12. A method for processing a lithographic printing plate precursor comprising an aluminium support, an image-receiving layer and a silver halide emulsion layer, said method comprising:

(i) information-wise exposing the plate precursor; and (ii) processing the exposed precursor through a processing liquid contained in an apparatus as defined in claim 1 or 2, thereby to prevent the formation of an undesirable electrochemical cell by creating an earth connection to the plate during its passage through said processing liquid.

13. A method as defined in claim 12 wherein said processing liquid comprises an aqueous alkaline solution including at least one development agent and at least one silver halide solvent.

14. A method as defined in claim 13 wherein said developing agent comprises a hydroquinone derivative in combination with a secondary developing agent.

15. A method as defined in claim 14 wherein said secondary developing agent comprises 1-phenyl-3-pyrazolidone or a derivative thereof.

16. A method as defined in claim 12 wherein said silver halide solvent comprises sodium thiosulphate pentahydrate.

17. A method as defined in claim 12 wherein said processing liquid additionally includes amines or alkanolamine derivatives.

* * * * *